(12) United States Patent
Halder et al.

(10) Patent No.: US 10,732,124 B2
(45) Date of Patent: Aug. 4, 2020

(54) METHODS FOR DETECTING DEFECTS OF A LITHOGRAPHIC PATTERN

(71) Applicant: IMEC VZW, Leuven (BE)

(72) Inventors: Sandip Halder, Bierbeek (BE); Philippe Leray, La Hulpe (BE)

(73) Assignee: IMEC VZW, Leuven (BE)

( * ) Notice: Subject to any disclaimer, the term of this patent is extended or adjusted under 35 U.S.C. 154(b) by 119 days.

(21) Appl. No.: 16/125,107

(22) Filed: Sep. 7, 2018

(65) Prior Publication Data

US 2019/0079023 A1 Mar. 14, 2019

(30) Foreign Application Priority Data

Sep. 12, 2017 (EP) .................................... 17190509

(51) Int. Cl.
| | |
|---|---|
| *G06T 7/00* | (2017.01) |
| *G01N 21/88* | (2006.01) |
| *G03F 7/20* | (2006.01) |
| *G01N 21/95* | (2006.01) |
| *G01N 21/956* | (2006.01) |

(52) U.S. Cl.
CPC ..... *G01N 21/8851* (2013.01); *G01N 21/9501* (2013.01); *G03F 7/7065* (2013.01); *G03F 7/70616* (2013.01); *G03F 7/70641* (2013.01); *G06T 7/0006* (2013.01); *G01N 21/956* (2013.01); *G01N 2021/8887* (2013.01);
(Continued)

(58) Field of Classification Search
CPC ............. G01N 21/885; G01N 21/9501; G01N 2021/8887; G01N 21/956; G06T 7/0006; G06T 2207/30242; G06T 2207/10061; G06T 2207/30148; G03F 7/7085; G03F 7/70641; G03F 7/70616; G03F 7/7065

USPC ........ 382/149, 144, 266; 356/388, 401, 503, 356/625, 73, 237.2, 237.3, 237.4, 237.5, 356/237.6, 398, 389; 702/94, 155, 172, 702/57, 58; 438/16; 257/48, E21.53; 250/201.2, 201.4; 348/86, 125, 126, 87
See application file for complete search history.

(56) References Cited

U.S. PATENT DOCUMENTS 6,836,560 B2 * 12/2004 Emery ............. G01N 21/95607
356/237.6
7,876,438 B2 * 1/2011 Ghinovker .......... G03F 7/70633
356/388
(Continued)

FOREIGN PATENT DOCUMENTS

JP 2010-170002 A 8/2010

OTHER PUBLICATIONS

European Search Report, European Patent Application No. 17190509. 4, dated Apr. 5, 2018, 6 pages.

*Primary Examiner* — Sheela C Chawan
(74) *Attorney, Agent, or Firm* — McDonnell Boehnen Hulbert & Berghoff LLP

(57) ABSTRACT

Example embodiments relate to methods for detecting defects of a lithographic pattern. One example embodiment includes a method for detecting defects of a lithographic pattern on a semiconductor wafer that includes a plurality of die areas. Each of the die areas has a region of interest (ROI) that includes a plurality of features forming the lithographic pattern. The method includes acquiring an image of at least one of the ROIs. The method also includes removing features touching an edge of the image. Further, the method includes counting a number of remaining features in the image.

15 Claims, 6 Drawing Sheets

(52) U.S. Cl.
CPC ............... *G06T 2207/10061* (2013.01); *G06T 2207/30148* (2013.01); *G06T 2207/30242* (2013.01)

(56) References Cited

U.S. PATENT DOCUMENTS

| | | | |
|---|---|---|---|
| 7,957,579 B2 | 6/2011 | Hiroi et al. | |
| 9,092,846 B2 | 7/2015 | Wu et al. | |
| 9,165,355 B1 * | 10/2015 | Tsuchiya | G03F 1/84 |
| 9,202,763 B2 * | 12/2015 | Miyoshi | H01L 22/12 |
| 9,542,740 B2 * | 1/2017 | Kim | G06T 7/001 |
| 9,767,547 B2 * | 9/2017 | Takeda | G06T 7/001 |
| 9,846,934 B2 * | 12/2017 | Zafar | G06T 7/001 |
| 9,910,348 B2 * | 3/2018 | Han | G06F 30/398 |
| 9,990,708 B2 * | 6/2018 | Toyoda | G06T 7/001 |
| 2011/0276935 A1 | 11/2011 | Fouquet et al. | |
| 2011/0296362 A1 * | 12/2011 | Ishikawa | G06T 7/001 |
| | | | 716/112 |
| 2017/0160648 A1 | 6/2017 | Tel et al. | |

* cited by examiner

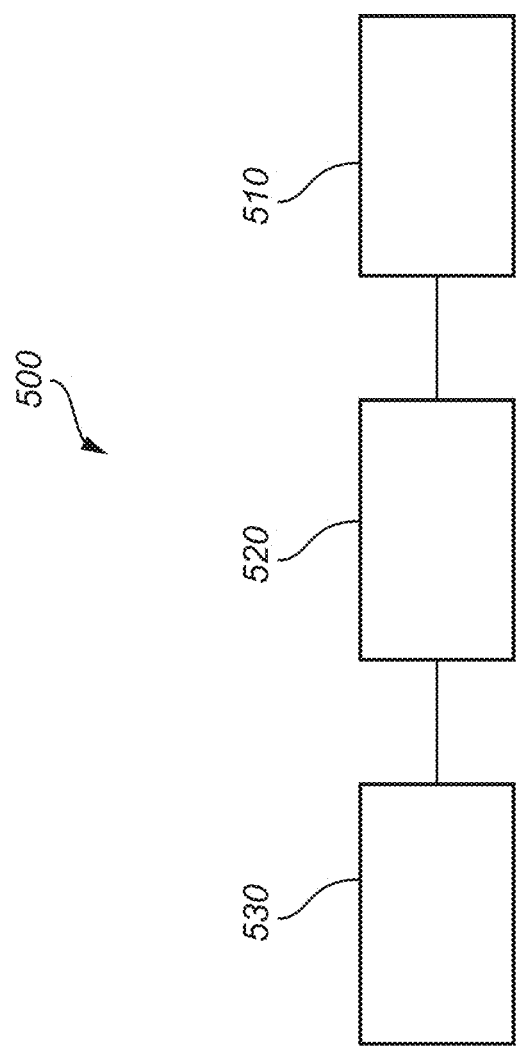

METHODS FOR DETECTING DEFECTS OF A LITHOGRAPHIC PATTERN

CROSS-REFERENCE TO RELATED APPLICATIONS

The present application is a non-provisional patent application claiming priority to European Patent Application No. EP 17190509.4, filed Sep. 12, 2017, the contents of which are hereby incorporated by reference.

FIELD OF THE DISCLOSURE

The present disclosure relates to a method and system for detecting defects of a lithographic pattern used for the production of semiconductor devices.

BACKGROUND

Lithography becomes more challenging with the continuous shrink in technology nodes. One attempt to meet the increasing requirements has been to use multiple patterning techniques, in which a pattern is built up by using a plurality of masks per layer. At the same time, the reduced spacing or pitch of the features has led to increasing inspection challenges and defection location detection. Optical inspection tools can give a rough position, but are due to their limited resolution not capable of pin-pointing the exact position within an optical image in which a feature is failing. Review-Scanning Electron Microscope (SEM) may be used for further analysis at the optical defect location, but this is a manual process that is highly time consuming and prone to errors. Another technique utilizes E-beam inspection, which also suffers from a low throughput. Thus, there is a need for improved methods for detecting and locating defects.

SUMMARY

The present disclosure provides an improved method for detecting and locating defects. Further and alternative embodiments will be understood from the following.

The printed lithographic pattern often deviates from the intended lithographic mask design due to errors and phenomena introduced as the pattern is transferred from the mask to the substrate. An important factor affecting the quality of the pattern is the quality and performance of the lithographic tool, which may vary unpredictably due to for example inaccuracies in the tool, wear, and environmental changes. The quality of focus and exposure energy (or dose) is of particular interest, wherein the former may be expressed in terms of tolerance with respect to perfect focus (i.e., zero de-focus), resulting in for example a range of de-focus values on either side of the zero de-focus state, and the latter expressed as, e.g., a variation in dose. If the deviations in the pattern are large enough to have a detrimental effect on the operation of the intended final structure, they may be referred to as errors or defects.

Example of errors or defects may include unintended bridging between neighboring pattern features, e.g., caused by positioning errors, a deviating outline or shape of the features, or contaminating structures arranged between the features. Other examples include cutting or separation of an intended pattern feature into two or more parts. These examples make use of the understanding that a "feature," in the context of a lithographic pattern, may correspond to an area that forms a continuous shape of the lithographic pattern, i.e., an area that is defined by an uninterrupted and closed outline. Examples of features and possible defects will be discussed in detail in connection with the appended drawings.

Hence, according to a first aspect, there is provided a method for detecting defects of a lithographic pattern on a semiconductor wafer comprising a plurality of die areas. Each of the die areas has a region of interest (ROI), comprising a plurality of features forming the lithographic pattern. The present method involves acquiring an image of at least one of the ROIs and counting the number of pattern features represented in the image.

Example embodiments make use of the realization that the number of pattern features represented in an acquired inspection image can be used as an indication of defects, which may be quantified by comparing an actual number of features of an image with a reference number of features. The reference number of features may be obtained in several different ways, such as by statistical analysis of a plurality of images or ROIs, a comparison with a neighboring ROI or die, or from the design layout file.

The method may further make use of the fact that the lithographic pattern may be repeated between different dies. By collecting images on a particular and same position within each die, each image may be aligned in similar manner with respect to the lithographic pattern and thus easily compared to each other. Such a comparison may be relatively fast and easy, and any deviation between images of different die areas may be labelled as defects.

A faster and more reliable analysis of the lithographic pattern is hence provided, not at least since possible defects can be automatically detected without manual inspection and/or analysis by an operator. Further, counting the number of features in each image may require less processing resources as compared to other methods based on analysis of, e.g., the outline, shape or area of the pattern features, or on comparing images with each other.

In some embodiments, features touching an edge of the image may be removed from the image prior to the counting of the features. In other words, features not entirely enclosed or included in the image may be excluded from the counting, which thus may include only the number of remaining features in the image. This allows for a more robust defect quantification, as features (or feature edges) arranged at the periphery of the image (or ROI) otherwise may be counted for some images only, depending on positioning errors of the image. If such a feature is visible in a particular image due to a misalignment or positioning error of that image, the feature may erroneously be interpreted as a defect. Similarly, is such a feature is not counted due to the same reason, it may be unintentionally regarded as a failure. Hence, by removing features touching an edge of the image, the accuracy of the method may be increased.

Further, the removal of features touching an edge of the image also allows for the area of the remaining features to be more accurately analyzed. By removing features that do not have their entire area included in the image, the absolute (or relative) area of the remaining features may be better determined or studied. This may, e.g., allow for area variations between features of different images, ROIs or dies to be determined and monitored, and possible errors detected or quantified in terms of area deviations.

In the present context, a "lithographic pattern" may be defined as a pattern of features or shapes formed on a semiconductor wafer or substrate. The lithographic pattern may be provided by exposing a resist layer, e.g., by direct printing or through a lithographic mask, developing the resist, and, in some embodiments, removing the resist from the exposed or non-exposed areas, depending on the type of resist that is used. This may yield a resist layer in which the features form trenches or lines in the shape of the pattern.

The terms "feature," "shape," or "component" may refer to a component or area forming the lithographic pattern or the lithographic pattern as reproduced in the image. The pattern as seen on the image may hence be formed of one or several features, which may be subject to image analysis for classification and analysis.

The lithographic pattern may deviate from the so-called "design intent" or "design layout," which may be understood as the theoretical shape of the pattern of features. The actual printed features (for example trenches in a resist layer) may approximate the design intent as much as possible, but deviations may be difficult to avoid due to process parameters related to the printing process.

The lithographic pattern may be reproduced as an image, acquired by, e.g., an inspection tool such as, e.g., a scanning electron microscope (SEM). The image may thus be understood as a two-dimensional representation of the lithographic pattern, in which the features of the pattern may appear as two-dimensional shapes in the plane of the image. In some embodiments, the image may be binarized, i.e., converted to only black and white, prior to being analyzed.

The area of the pattern that is subject to the defect analysis may be referred to as the region of interest, ROI. The acquired image may coincide with the ROI, or overlap with it. In some embodiments, the ROI may correspond to a particular position on each die area, such that each ROI comprises (or is intended to comprise) the same set of features. It will however be appreciated that the ROI in some examples also may coincide with the entire die area.

According to an embodiment, the method may further comprise a step of comparing the number of (remaining) features of the image of the ROI with a target number, or reference number, of features, and a step of flagging the ROI as defect in case the number of features differs from the target number. If the number of counted features exceeds the target number, this may be an indication that one or several of the features comprises a defect in the form of an unintended gap that splits the feature into two or more separate parts. If the number of counted features instead lies below the target number, this may be an indication of a defect in the form of a missing feature or a bridging between two or more features in the image. In both cases, the deviations may be flagged as defects and, possibly, the deviation used as a measure of the severity of the defect.

In an embodiment, the target number may correspond to the design intent number acquired from the design layout. This may allow for a faster analysis, as defects may be detected as deviations from the design intent number without comparing different images with each other.

Alternatively, or additionally, the target number may be determined by statistical analysis of a plurality of images. This may, e.g., be achieved by counting the number of features of each one of the images, and determining which value, i.e., which number of counted features, that appears most often. This value may also be referred to as the mode number of features, and, hence, represents the most common number of features of an image. Assuming that a majority of the images or ROIs contain no detectable defects, those images or ROIs that deviate from the most common number of features may then be defined as defect.

Using statistical analysis, such as, e.g., the mode number described above, makes the present method suitable also in cases when the design intent number is unknown. Thus, the method may be used for analyzing any type of repeating lithographic pattern, given that access is given to a plurality of images of the same position within each die.

Example embodiments may further be employed when estimating a process window of the features. A process window may define the printability performance limits in terms of, e.g., focus and dose settings of a lithographic printing tool, within which limits a reliable print of the pattern is obtainable. Some patterns or features can have a larger process window than others, due to various reasons such as design geometry and optical phenomena taking place during the exposure. Particularly sensitive areas of the pattern, which are likely to be printed incorrectly due to, e.g., certain geometrical parameters of the design and their interaction with optical phenomena occurring during the exposure of the mask, are sometimes referred to as hotspots. It may therefore be of particular interest to determine the process window for those areas.

Thus, according to an embodiment, the method may comprise a step of printing, by a lithographic tool, the lithographic pattern on the plurality of die areas, while varying a lithographic parameter between different die areas. The number of features in each die area may then be determined as a function of the lithographic parameter, and a process window determined as the limits between which the lithographic parameter can vary without the number of features deviates from a target number of features. The lithographic parameter may be at least one of dose, focus, and overlay, which may be varied so as to determine at which parameter offset a particular feature (or any feature) or hotspot starts failing by showing a change in the number of components. Further, this approach may be used to understand at which position within a feature the failure tends to occur, which may be used to guide, e.g., CD-SEMs to the exact location for automatic measurement gauge setup.

In one example, the process window may be estimated using a test wafer, such as, e.g., a Critical Dimension Uniformity (CDU) wafer or a Focus Exposure energy Matrix (FEM) wafer. The test wafer may comprise a plurality of die areas arranged in rows and columns. The central column of dies may, e.g., be a modulated focus column, representing die areas where a particular pattern is printed with incrementally changing de-focus values deliberately applied in the lithographic printing tool. The central die may represent the zero de-focus position of the lithographic mask with respect to the wafer, i.e., the best obtainable in-focus print of the die. Above and underneath the central die, de-focused prints may be produced at incrementally increasing de-focus values on either side of the zero value, in steps of, e.g., +10 nm and −10 nm, obtained by, e.g., displacing the lens assembly of the tool in steps with respect to the zero de-focus position, or by displacing the wafer stage with respect to the lens assembly. The rest of the dies in the wafer (outside the central column) may be zero de-focus dies, but could also be additional de-focused prints. In some embodiments, a zero de-focused column may be printed next to a modulated focus column in order to facilitate the detection of defects by comparing the number of features of two dies of adjacent columns.

According to some embodiments, a position of the ROIs may be located prior to the image is acquired. This may, e.g., be achieved by extracting hotspots from the design layout and use these for the subsequent detection of defects. In another example, the position of the ROIs may be determined using optical inspection of at least some of the dies. Even though the optical inspection may have a too low resolution or accuracy to efficiently locate or classify a defect, the average deviation of the intensity pattern of the optical image (e.g., as compared to other images of corresponding locations of other dies) may be used to detect that there may be a defect within the ROI. Thus, the optical inspection may be completed with an additional, a more thorough inspection according to example embodiments. The optical inspection may be performed as an initial step for detecting specific ROIs within a die that should be further inspected for defects, or for detecting specific dies that should be further checked.

Thus, example embodiments may be realized by an initial inspection by an optical inspection tool, which can give a rough position of a suspected defect. A subsequent inspection, e.g., using a review SEM, may then be performed at the suspected defect location, and the acquired images analyzed according to the above described embodiments.

In one example, hotspots or specific feature locations in which defects are likely to occur first, may be determined using, e.g., the test wafer as discussed above, or using post-processing of the acquired images. Examples of such techniques may, e.g., include dilation and erosion, by which the features of the images are gradually and systematically distorted until the number of features changes. In erosion techniques, one pixel at the time may be removed from the boundary of the feature, until the feature is counted as two separate features. In dilation techniques, the pixels are gradually added to the boundary until two features eventually merges into one. Dilation or erosion can then be used to find a specific location or feature, within the ROI, which is failing. Once that location or feature is known, the design layout may be used for determining how many times this feature or location is repeating. Based on this information, optical inspection may be performed on those particular sites of the design. In other words, the specific locations may be inspected and analyzed across the die, which may reduce random noise and makes the optical inspection tool more sensitive, since it is looking at a specific type of feature. Thus, SEM tools may be used for finding which feature is failing within a ROI, wherein this information is used as feedback to the optical inspection tool for generating similar areas from the design layout and running a full die inspection for these areas.

According to an embodiment, the step of removing features touching an edge of the image may include removing all such features except line/space features having no more than one intended line-end position positioned within the image. In that way, example embodiments may be utilized for detecting defects (such as bridges and cuts) also in line/space patterns.

According to a second aspect, a system may be provided for carrying out the method according to the first aspect. The system may comprise a SEM for acquiring the image and a processing unit for counting the number of features in the image. The processing unit may further be configured to remove features touching an edge of the image.

In an embodiment, the system also comprises an optical analysis tool for optically inspecting at least some of the dies to locate a position of the ROIs, and/or to determine a die of interest that should be subject to further and more detailed inspection.

Either of the SEM, the optical analysis tool and the processing unit may be structurally integrated in the system. They may also be structurally distinct, i.e., physically separated and/or located on different geographical positions, even if connected or being connectable to each other via, e.g., a communication network.

The processing unit may include a processor or any other electrical circuitry capable of performing the image analysis. The physical implementation may, e.g., be an integrated implementation, or a distributed implementation in which the responsibilities and functionalities are handled by cooperating components.

Example embodiments may include computer readable instructions for controlling a programmable computer in such manner that it causes an inspection tool or a system as described above to perform the methods outlined above. Such instructions may be distributed in the form of a computer program product comprising a non-volatile computer-readable medium storing the instructions.

Example embodiments relate to all possible combinations of features recited in the claims. Further, it will be appreciated that the various embodiments described for the method according to the first aspect are all combinable with embodiments described for the system according to the second aspect. Further, features of example embodiments will become apparent when studying the following detailed disclosure, the drawings, and the appended claims. It will be understood that different features of example embodiments can be combined to create embodiments other than those described in the following.

BRIEF DESCRIPTION OF THE DRAWINGS

The above, as well as additional features, will be better understood through the following illustrative and non-limiting detailed description of example embodiments, with reference to the appended drawings.

FIG. 5 is a schematic illustration of a system, according to example embodiments.

As illustrated in the figures, the size of the elements, features, and other structures may be exaggerated or not depicted proportionally for illustrative purposes. Thus, the figures are provided to illustrate the general elements of the embodiments.

DETAILED DESCRIPTION

Example embodiments are concerned with analysis of defects that may occur in lithographic patterns. Examples of such defects will be described in the following with reference to FIGS. 1A-1C, which illustrate three different images taken at the same position within three different dies of a patterned semiconductor wafer. The images may be considered to illustrate the features 201-206 included in an ROI 200 of the respective dies. The images may, e.g., be acquired by an inspection tool, such as, e.g., a SEM.

Figure 1A:
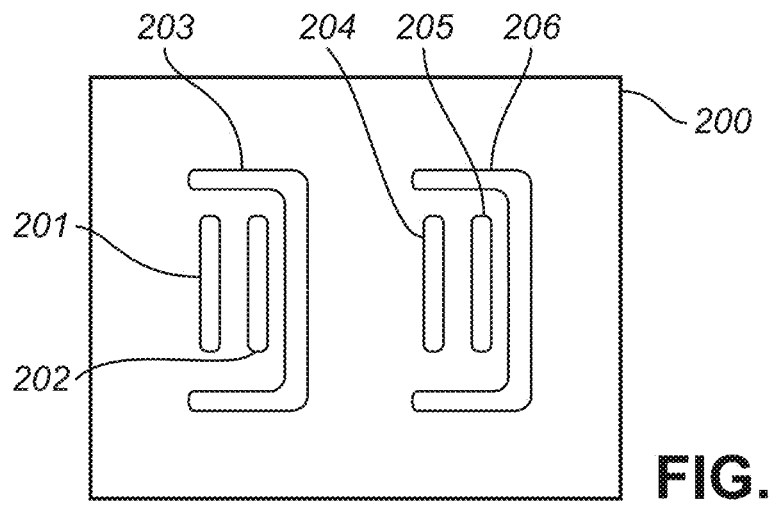
FIG. 1A is an illustration of a ROI that includes a plurality of features of a lithographic pattern, according to example embodiments.

As shown in FIG. 1A, the lithographic pattern of the ROI 200 may comprise six features or components 201-206, in this example two pairs of vertical lines 201, 202; 204, 205 and two brackets 203, 206. Each feature 201-206 may be defined by a continuous outline enclosing an area, which, e.g., may correspond to a trench in the resist layer provided on a surface the semiconductor wafer or substrate. If the pattern of features 201-206 illustrated in FIG. 1A is considered to not comprise any defects, the number of features 201-206 (in this case six) of the ROI 200 may be referred to as a reference number or target for the number of features within this particular ROI of the pattern.

Figure 1B:
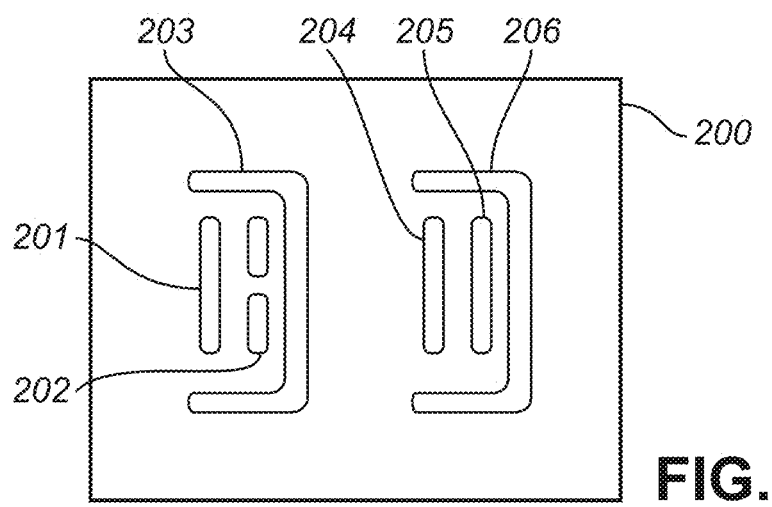
FIG. 1B is an illustration of a ROI that includes a plurality of features of a lithographic pattern, according to example embodiments.

In FIG. 1B, it is noted that the vertical line-shaped feature 202 comprises a defect, realized as a cut into two separate parts—a first, upper part and a second, lower part. When counting the number of features, this cut results in a total number of seven features 201-206 in the ROI 200. Thus, when comparing to the reference number, or intended number of features or components in FIG. 1A, the feature 202 of FIG. 1B can be defined as a defect.

Figure 1C:
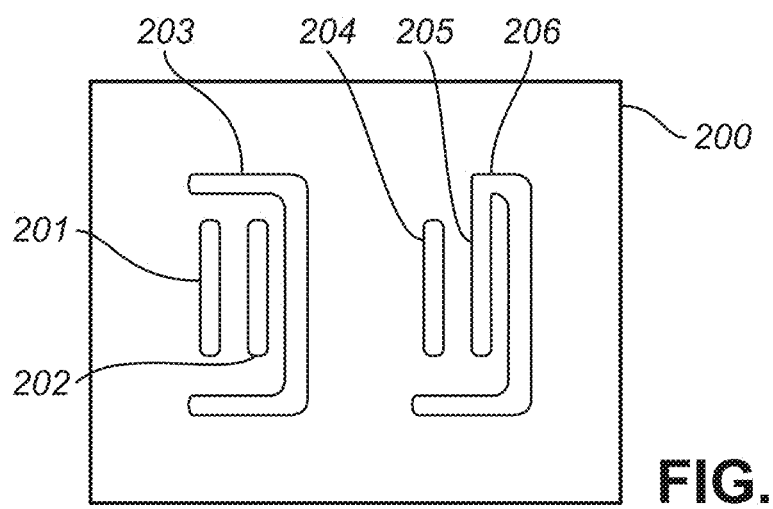
FIG. 1C is an illustration of a ROI that includes a plurality of features of a lithographic pattern, according to example embodiments.

A similar analysis can be employed to the ROI 200 of FIG. 1C, in which the feature 205 has been bridged or merged with feature 206. Thus, the number of features in FIG. 1C has been reduced to five and can therefore be regarded as a defect when compared with the reference of FIG. 1A.

It will be understood that the present examples are merely illustrations of two possible printing error or pattern defects. Other types of defects, resulting in a deviating number of features, are however equally conceivable. The counted number of features may be compared to a target number of features, such as the features of a defect-free ROI as described with reference to FIGS. 1A-1C. The target number may however also be retrieved, e.g., from the design layout, be determined manually by an operator, or statistically as, e.g., a mode number of a plurality of images.

Figure 2A:
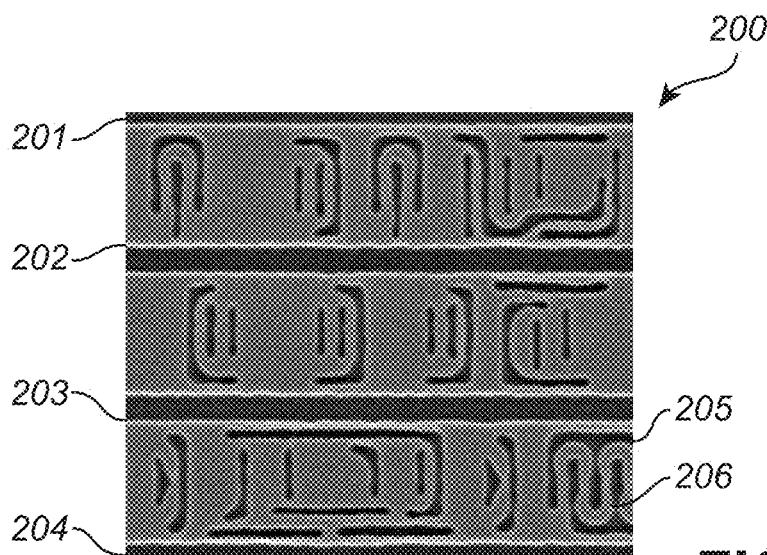
FIG. 2A is an illustration of a ROI in which some features are removed prior to counting, according to example embodiments.
Figure 2B:
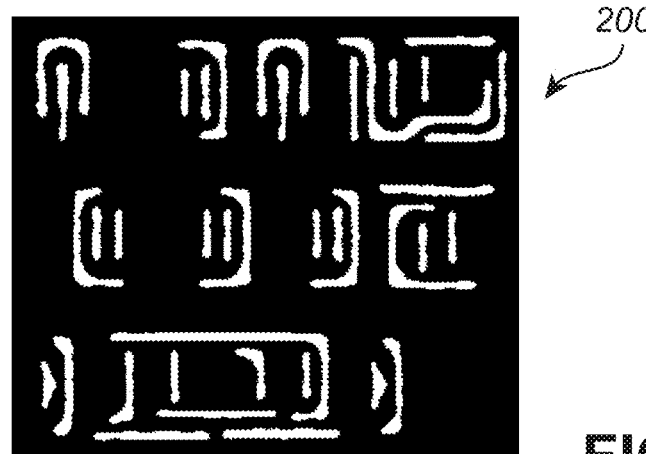
FIG. 2B is an illustration of a ROI in which some features are removed prior to counting, according to example embodiments.
Figure 2C:
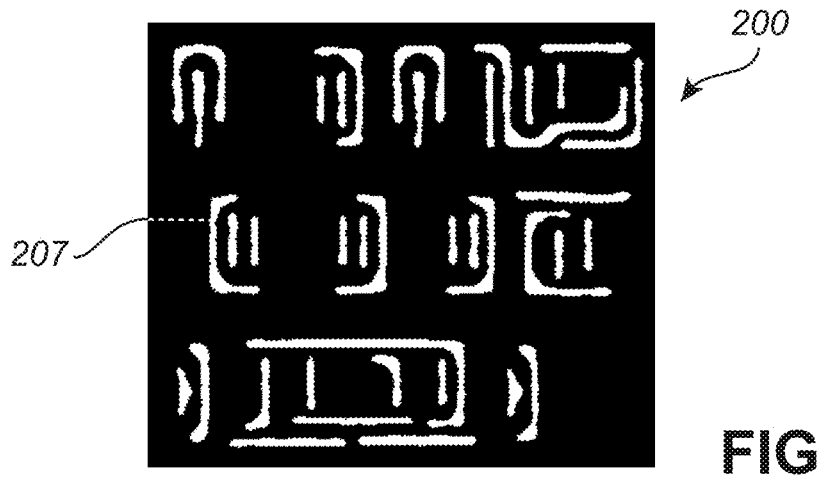
FIG. 2C is an illustration of a ROI in which some features are removed prior to counting, according to example embodiments.

FIGS. 2A-2C illustrate images of a similar pattern as illustrated in FIGS. 1A-1C, in which features may be counted to detect defects according to example embodiments. The images illustrate a ROI 200, comprising a plurality of features forming a lithographic pattern of a semiconductor wafer.

FIG. 2A illustrates an image as acquired by, e.g., a review-SEM, whereas FIG. 2B illustrate the image after binarization into black and white, and after features that touch an edge of the image have been removed. Thus, the horizontal line/space features 201, 202, 203, 204, which all touches one or several edges of the image, has been removed together with features 205, 206 which touches the lower right corner of the image frame. The remaining number of features may then be counted, resulting in 38 features.

In FIG. 2C, one of the features 207 has broken into two parts, which adds one to the counted number of remaining features. Thus, the defect pattern of the ROI 200 in FIG. 2C may be flagged as a defect as it contains 39 features instead of the intended number of 38 features as shown in FIG. 2B.

Figure 3:
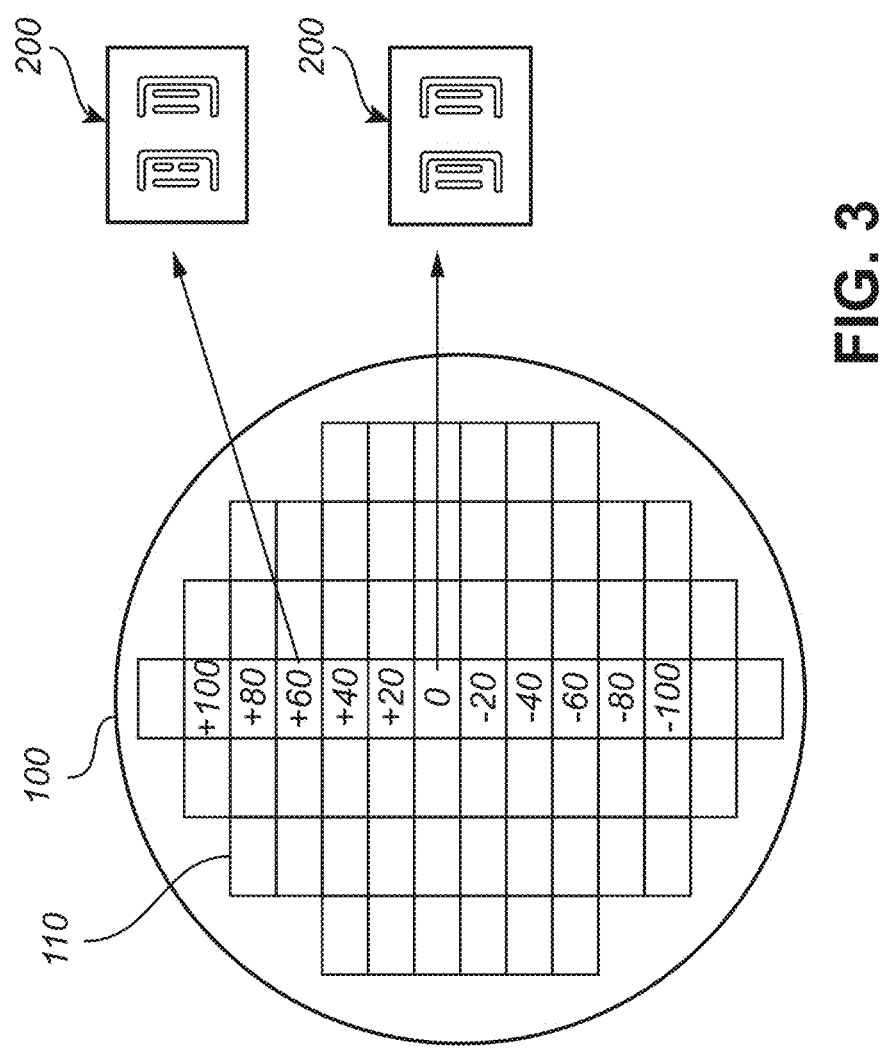
FIG. 3 is a schematic layout of a semiconductor wafer that includes a plurality of die areas printed with different lithographic parameter settings, according to example embodiments.

FIG. 3 illustrates a test wafer 100, such as, e.g., a FEM wafer, used for determination of a process window according to example embodiments. The test wafer 100 may comprise a plurality of die areas 110 arranged in a matrix of rows and columns. In the present example, the central column may be a modulated focus column, in which the die areas 110 have been provided with a pattern that is printed with incrementally changing de-focus values applied to the lithographic tool (the de-focus may also be achieved by local un-evenness of the wafer surface). The central die may represent the zero de-focus position, printed with the best obtainable in-focus of the tool. Above and underneath the central die, the focus may be shifted increasingly from the zero value, e.g., by average values of +20, +40, +60, +80 and +100 nm above the central die and average values of −20, −40, −60, −80 and −100 nm below the central die.

The process window, which, e.g., may define the limits between which a lithographic parameter, such as, e.g., the de-focus value, can vary without resulting in defects, may thus be determined by analyzing the quality of the lithographic pattern produced in each one of the dies of the central column. As illustrated in the example of FIG. 3, the central die comprises a ROI 200 with six features. In the +60 die, one of the features has broken into two separate parts, which results in a total of seven features. The defect may be detected using a method similar to any of the previously described embodiments. In this way, the upper de-focus limit for the process window may be determined to +40 nm, if +60 nm is considered as the de-focus value that causes a defect in the pattern.

A similar approach may be used for detecting hotspots, such as, e.g., overlay sensitive hotspots. A lithographic pattern may be produced in a semiconductor wafer which may be similarly configured as the test wafer of FIG. 3, using a systematically varying overlay between different dies. The overlay may, e.g., vary in the x-direction (i.e., horizontal direction) in one column, the y-direction (i.e., vertical direction) in another column, and in both the x-direction and the y-direction in a third column. The number of features of a particular ROI may then be monitored for the different dies, and defects noted as deviations in the number. When a defect is detected, the particular die may be further analyzed to localize exactly which feature is failing.

Figure 4A:
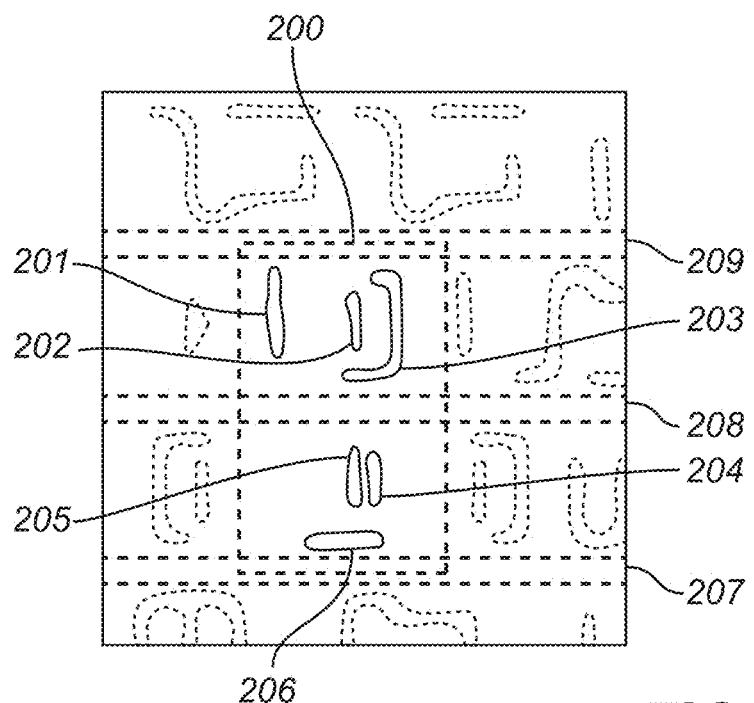
FIG. 4A is an illustration of a ROI of an image and the detection of a hotspot, according to example embodiments.
Figure 4B:
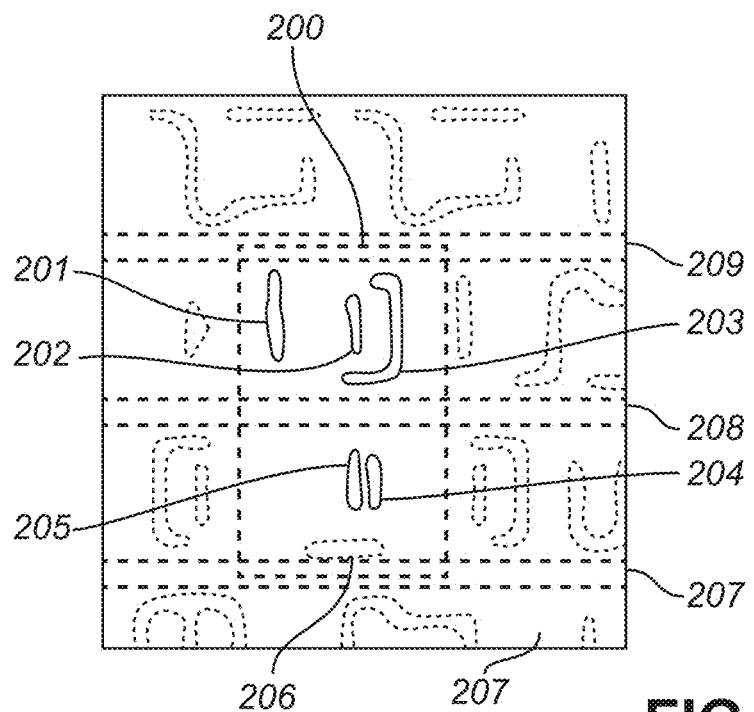
FIG. 4B is an illustration of a ROI of an image and the detection of a hotspot, according to example embodiments.

FIGS. 4A and 4B are images of a ROI 200 of two different dies on such a wafer. In this example, features touching the edges of the image may be removed, such that only features 201-206 of FIG. 4A are counted. In the present example, the ROI therefore comprises six features 201-206.

FIG. 4B is an image of a die which has been printed with an overlay in the y-direction, resulting in a slight translation of the features 201-206 in the vertical direction relative the line/space features 207, 208, 209. This vertical shift causes the distance between the lowermost feature 206 and the line feature 207 to be reduced to such extent that the lowermost feature 206 interferes with the line feature 207. As illustrated in the image of FIG. 4B, they now appear to be connected or bridged, and are therefore regarded as a single feature. As a result, both features will be removed from the counting and hence excluded from the total number of features. Had the line feature 207 not been removed, they would have been regarded as a single feature and, thus, counted only once.

The overlay in the y-direction therefore results in a defect, which is detected as a reduction in the number of counted features from six to five. The location of the defect feature 206 may therefore be regarded as a hotspot, which is likely to fail first upon an overlay in the y-direction.

It is appreciated that the above embodiments discussed in connection with FIGS. 3, 4A, and 4B merely are illustrative examples of applications and uses for determining process window and hotspots. It will be understood that many other variations and combinations are conceivable within the scope of the claimed embodiments.

FIG. 5 is a schematic illustration of a system 500 for detecting defects according to any one of the previously described embodiments. The system 500 may comprise an optical analysis tool 530 configured to optically inspect at least some of the dies to locate a ROI and/or a die of interest. The ROI or die may comprise a suspected defect, which may require further inspection and analysis. For this purpose, the system 500 may further comprise an inspection tool, such as, e.g., a scanning electron microscope SEM 510, for acquiring an image of the ROI which may have been determined by the optical analysis tool 530. Further, a processing unit 520 may be provided for performing the analysis of the acquired image.

Figure 6:
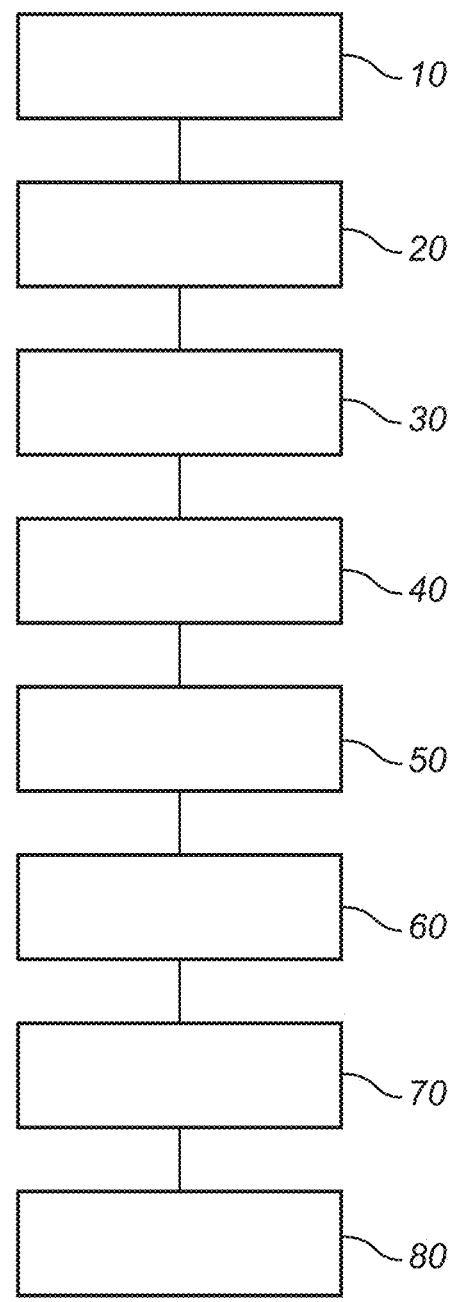
FIG. 6 is a diagram illustrating a method for detecting defects of a lithographic pattern on a semiconductor wafer, according to example embodiments.

FIG. 6 is a schematic representation of a method according an embodiment, which in part or in full may be performed using a system according to FIG. 5. In a first step, a lithographic pattern is printed 10 on a plurality of die areas of a semiconductor wafer. During the printing, a lithographic parameter, such as, e.g., dose, focus or overlay, may be varied between different die areas in order to determine a process window and/or hotspot of the pattern. The printed lithographic pattern may be optically inspected 20 by, e.g., an optical analysis tool. The optical inspection may result in one or several areas, such as, e.g., ROIs or die areas, which appear to comprise a defect. Those areas may then be subject to a further inspection, in which an image may be acquired 30 by, e.g., a SEM in order to detect and/or classify the suspected defect. The detection may comprise a step of removing 40, from the image, pattern features that touches an edge of the image, and counting 50 the remaining number of features in the image. A statistical analysis 60 of the counted numbers may then be performed, which, e.g., may result in a mode number representing the most common number of features in each image. This mode number may be used as a target or reference number, against which the number of features of each image may be compared 70. Deviations from the target number may be flagged 80 as defects.

Embodiments have mainly been described with reference to a limited number of examples. However, as is readily appreciated, other examples than the ones disclosed above are equally possible within the scope of the disclosure, as defined by the appended claims. Variations to the disclosed embodiments may be understood and effected in practicing example embodiments, from a study of the drawings, the disclosure and the appended claims.

What is claimed is:

1. A method for detecting defects of a lithographic pattern on a semiconductor wafer comprising a plurality of die areas, wherein each of the die areas has a region of interest (ROI) comprising a plurality of features forming the lithographic pattern, and wherein the method comprises:
   printing, by a lithographic tool, the lithographic pattern on the plurality of die areas, wherein a lithographic parameter is varied between different die areas;
   acquiring an image of at least one of the ROIs;
   removing features touching an edge of the image;
   counting a number of remaining features in the image;
   determining the number of remaining features in each die area as a function of the lithographic parameter; and
   determining, based on the number of remaining features, a process window defining limits between which the lithographic parameter can vary without the number of features deviating from a target number of features.

2. The method according to claim 1, further comprising:
   comparing the number of remaining features of the image of the ROI with the target number of features; and
   flagging the ROI as defect when the number of remaining features in the image differs from the target number of features.

3. The method according to claim 2, wherein the target number of features is a design intent number of features of a design layout of the lithographic pattern.

4. The method according to claim 1, comprising:
   acquiring an image of each one of a plurality of ROIs;
   determining, for each image, the number of remaining features by:
      removing the features touching the edge of the image; and
      counting the number of remaining features in the image;
   determining a mode number of features for the images of the plurality of ROIs, wherein the mode number of features represents a most common number of features occurring across the images of the plurality of ROIs; and
   for each image:
      comparing the number of remaining features of the image with the mode number of features; and
      flagging the ROI associated with the image as defect when the number of features differ from the mode number of features.

5. The method according to claim 1, wherein the semiconductor wafer comprises a test wafer, wherein the test wafer is a critical dimension uniformity (CDU) wafer or a focus exposure energy matrix (FEM) wafer, wherein the die areas are arranged in rows and columns, and wherein a central column of dies corresponds to a modulated focus column.

6. The method according to claim 1, wherein the lithographic parameter comprises a dose, a focus, or an overlay.

7. The method according to claim 1, wherein, prior to acquiring the image of at least one of the ROIs, a position of the ROIs is located by extracting hotspots from a design layout of the lithographic pattern.

8. The method according to claim 1, wherein, prior to acquiring the image of at least one of the ROIs, a position of the ROIs is located using optical inspection of at least some of the die areas.

9. The method according to claim 1, wherein, prior to acquiring the image of at least one of the ROIs, a die of interest is determined using optical inspection of at least some of the die areas.

10. The method according to claim 1, wherein removing features touching the edge of the image comprises removing only those features touching the edge of the image having line/space features with more than one intended endpoint within the image.

11. The method according to claim 1, wherein the image is acquired using a scanning electron microscope (SEM).

12. The method according to claim 1, wherein the image is binarized prior to removing features touching the edge of the image.

13. A system for detecting defects of a lithographic pattern on a semiconductor wafer comprising a plurality of die areas, wherein each of the die areas has a region of interest (ROI) comprising a plurality of features forming the lithographic pattern, and wherein the system comprises:
- a scanning electron microscope (SEM) for acquiring an image of at least one of the ROIs;
- a processor for removing features touching an edge of the image;
- a processor for counting a number of remaining features in the image;
- a lithographic tool for printing the lithographic pattern on the plurality of die areas, wherein a lithographic parameter is varied between different die areas;
- a processor for determining the number of remaining features in each die area as a function of the lithographic parameter; and
- a processor for determining, based on the number of remaining features, a process window defining limits between which the lithographic parameter can vary without the number of features deviating from a target number of features.

14. The system according to claim 13, wherein the system further comprises an optical analysis tool configured to optically inspect at least some of the die areas to locate a position the ROIs.

15. The system according to claim 13, wherein the system further comprises an optical analysis tool configured to optically inspect at least some of the die areas to determine a die of interest.

* * * * *